(12) United States Patent
Wood et al.

(10) Patent No.: US 8,804,415 B2
(45) Date of Patent: Aug. 12, 2014

(54) ADAPTIVE VOLTAGE RANGE MANAGEMENT IN NON-VOLATILE MEMORY

(75) Inventors: Robert B. Wood, Niwot, CO (US); Jea Woong Hyun, South Jordan, UT (US); Hairong Sun, Superior, CO (US); Warner Losh, Broomfield, CO (US); David Flynn, Sandy, UT (US)

(73) Assignee: Fusion-io, Inc., Salt Lake City, UT (US)

( * ) Notice: Subject to any disclaimer, the term of this patent is extended or adjusted under 35 U.S.C. 154(b) by 150 days.

(21) Appl. No.: 13/527,418

(22) Filed: Jun. 19, 2012

(65) Prior Publication Data

US 2013/0336072 A1    Dec. 19, 2013

(51) Int. Cl.
| | |
|---|---|
| *G11C 16/04* | (2006.01) |
| *H01L 29/792* | (2006.01) |
| *G11C 16/10* | (2006.01) |
| *H01L 27/108* | (2006.01) |
| *G11C 11/404* | (2006.01) |

(52) U.S. Cl.
CPC .......... *G11C 16/0466* (2013.01); *H01L 29/792* (2013.01); *G11C 16/10* (2013.01); *H01L 27/108* (2013.01); *G11C 11/404* (2013.01)
USPC ................. 365/184; 365/210.12; 365/189.09; 365/185.24

(58) Field of Classification Search
CPC .. G11C 16/0466; G11C 16/10; G11C 11/404; H01L 29/792; H01L 27/108
USPC ................... 365/184, 210.12, 189.09, 185.24
See application file for complete search history.

(56) References Cited

U.S. PATENT DOCUMENTS

| | | | |
|---|---|---|---|
| 5,261,068 A | 11/1993 | Gaskins et al. | |
| 5,438,671 A | 8/1995 | Miles | |
| 5,701,434 A | 12/1997 | Nakagawa | |
| 5,845,329 A | 12/1998 | Onishi et al. | |
| 5,930,174 A * | 7/1999 | Chen et al. | 365/185.29 |
| 5,960,462 A | 9/1999 | Solomon et al. | |
| 6,000,019 A | 12/1999 | Dykstal et al. | |
| 6,170,039 B1 | 1/2001 | Kishida | |
| 6,170,047 B1 | 1/2001 | Dye | |
| 6,173,381 B1 | 1/2001 | Dye | |
| 6,185,654 B1 | 2/2001 | Van Doren | |
| 6,330,688 B1 | 12/2001 | Brown | |
| 6,356,986 B1 | 3/2002 | Solomon et al. | |
| 6,370,631 B1 | 4/2002 | Dye | |
| 6,385,710 B1 | 5/2002 | Goldman et al. | |

(Continued)

FOREIGN PATENT DOCUMENTS

WO    2007132457    11/2007

*Primary Examiner* — Jason Lappas
(74) *Attorney, Agent, or Firm* — Kenneth E. Horton; Kirton McConkie

(57) ABSTRACT

A method for adaptive voltage range management in non-volatile memory is described. The method includes establishing an adaptive voltage range for a memory element of an electronic memory device. The memory element includes at least two states. The adaptive voltage range comprises a lower state and an upper state. The method also includes establishing an adjustment process to implement a first adjustment of an abode characteristic of a first state and to implement a second adjustment of an abode characteristic of a second state in the adaptive voltage range in response to a trigger event, wherein the first adjustment of an abode characteristic of the first state is different from the second adjustment of an abode characteristic of the second state.

20 Claims, 8 Drawing Sheets

(56) References Cited

U.S. PATENT DOCUMENTS

| | | |
|---|---|---|
| 6,412,080 B1 | 6/2002 | Fleming et al. |
| 6,418,478 B1 | 7/2002 | Ignatius et al. |
| 6,523,102 B1 | 2/2003 | Dye et al. |
| 6,587,915 B1 | 7/2003 | Kim |
| 6,601,211 B1 | 7/2003 | Norman |
| 6,625,685 B1 | 9/2003 | Cho et al. |
| 6,671,757 B1 | 12/2003 | Multer et al. |
| 6,754,774 B2 | 6/2004 | Gruner et al. |
| 6,775,185 B2 | 8/2004 | Fujisawa et al. |
| 6,779,088 B1 | 8/2004 | Benveniste et al. |
| 6,785,785 B2 | 8/2004 | Piccirillo et al. |
| 6,877,076 B1 | 4/2005 | Cho et al. |
| 6,880,049 B2 | 4/2005 | Gruner et al. |
| 6,883,079 B1 | 4/2005 | Priborsky |
| 6,938,133 B2 | 8/2005 | Johnson et al. |
| 7,010,652 B2 | 3/2006 | Piccirillo et al. |
| 7,043,599 B1 | 5/2006 | Ware et al. |
| 7,050,337 B2 | 5/2006 | Iwase et al. |
| 7,089,391 B2 | 8/2006 | Geiger et al. |
| 7,181,572 B2 | 2/2007 | Walmsley |
| 7,194,577 B2 | 3/2007 | Johnson et al. |
| 7,219,238 B2 | 5/2007 | Saito et al. |
| 7,243,203 B2 | 7/2007 | Scheuerlein |
| 7,466,575 B2 | 12/2008 | Shalvi et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,751,240 B2 | 7/2010 | Shalvi |
| 7,773,413 B2 | 8/2010 | Shalvi |
| 7,821,826 B2 | 10/2010 | Shalvi et al. |
| 7,864,573 B2 | 1/2011 | Perlmutter et al. |
| 7,881,107 B2 | 2/2011 | Shalvi |
| 7,900,102 B2 | 3/2011 | Sokolov et al. |
| 7,925,936 B1 | 4/2011 | Sommer |
| 8,055,979 B2 | 11/2011 | Wu et al. |
| 8,130,553 B2 | 3/2012 | Buch et al. |
| 2002/0069317 A1 | 6/2002 | Chow et al. |
| 2002/0069318 A1 | 6/2002 | Chow et al. |
| 2003/0198084 A1 | 10/2003 | Fujisawa et al. |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0193166 A1 | 9/2005 | Johnson et al. |
| 2005/0246510 A1 | 11/2005 | Retnamma et al. |
| 2006/0004955 A1 | 1/2006 | Ware et al. |
| 2007/0016699 A1 | 1/2007 | Minami |
| 2007/0132452 A1 | 6/2007 | Alsop |
| 2007/0132453 A1 | 6/2007 | Ogino |
| 2007/0132456 A1 | 6/2007 | Salman et al. |
| 2007/0132457 A1 | 6/2007 | Okamoto et al. |
| 2007/0132458 A1 | 6/2007 | Allen |
| 2007/0198770 A1 | 8/2007 | Horii et al. |
| 2008/0026203 A1 | 1/2008 | Gates et al. |
| 2008/0053472 A1 | 3/2008 | Hadden |
| 2008/0053473 A1 | 3/2008 | Lee |
| 2008/0068747 A1 | 3/2008 | Sasaki et al. |
| 2008/0111058 A1 | 5/2008 | Feldman et al. |
| 2008/0126686 A1 | 5/2008 | Sokolov et al. |
| 2008/0130341 A1 | 6/2008 | Shalvi et al. |
| 2008/0139441 A1 | 6/2008 | Xiao et al. |
| 2008/0148115 A1 | 6/2008 | Sokolov et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0263262 A1 | 10/2008 | Sokolov et al. |
| 2008/0282106 A1 | 11/2008 | Shalvi et al. |
| 2009/0024905 A1 | 1/2009 | Shalvi et al. |
| 2009/0037691 A1 | 2/2009 | Master et al. |
| 2009/0043951 A1 | 2/2009 | Shalvi et al. |
| 2009/0050703 A1 | 2/2009 | Lifson et al. |
| 2009/0063450 A1 | 3/2009 | Petri |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0144600 A1 | 6/2009 | Perlmutter et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0091535 A1 | 4/2010 | Sommer et al. |
| 2010/0110787 A1 | 5/2010 | Shalvi et al. |
| 2010/0115376 A1 | 5/2010 | Shalvi et al. |
| 2010/0124088 A1 | 5/2010 | Shalvi et al. |
| 2010/0131826 A1 | 5/2010 | Shalvi et al. |
| 2010/0131827 A1 | 5/2010 | Sokolov et al. |
| 2010/0157641 A1 | 6/2010 | Shalvi et al. |
| 2010/0157675 A1 | 6/2010 | Shalvi et al. |
| 2010/0165689 A1 | 7/2010 | Rotbard et al. |
| 2010/0165730 A1 | 7/2010 | Sommer et al. |
| 2010/0195390 A1 | 8/2010 | Shalvi |
| 2010/0199150 A1 | 8/2010 | Shalvi et al. |
| 2010/0220509 A1 | 9/2010 | Sokolov et al. |
| 2010/0220510 A1 | 9/2010 | Shalvi |
| 2010/0250836 A1 | 9/2010 | Sokolov et al. |
| 2010/0332955 A1 | 12/2010 | Anholt |
| 2012/0239868 A1 | 9/2012 | Ryan et al. |

\* cited by examiner

ADAPTIVE VOLTAGE RANGE MANAGEMENT IN NON-VOLATILE MEMORY

BACKGROUND

Some conventional flash memory and other solid-state memory devices implement multi-level cell (MLC) memory elements to store multiple bits of data in the same memory cell. Storing multiple bits of data in the same memory element increases the capacity of the flash memory. In general, the MLC memory elements are programmable to multiple states, which are each characterized by separate voltage thresholds. As an example, a two-bit MLC memory element can be programmed to one of four different states, each state corresponding to a unique voltage range.

Newer memory elements typically have much greater accuracy than older memory elements. Taking advantage of the greater accuracy of newer memory elements may help increase the longevity of the devices. However, storing multiple bits of data in the MLC memory elements also typically decreases the longevity of the device in various ways, including the number of times each memory element can be accurately written, the number of times each memory element can be accurately read per write, and the ability to maintain the accuracy of the data, for example, when the flash memory is not powered, is operating at high temperatures, or under other conditions.

BRIEF DESCRIPTION OF THE DRAWINGS

Throughout the description, similar reference numbers may be used to identify similar elements.

DETAILED DESCRIPTION

Figure 1:
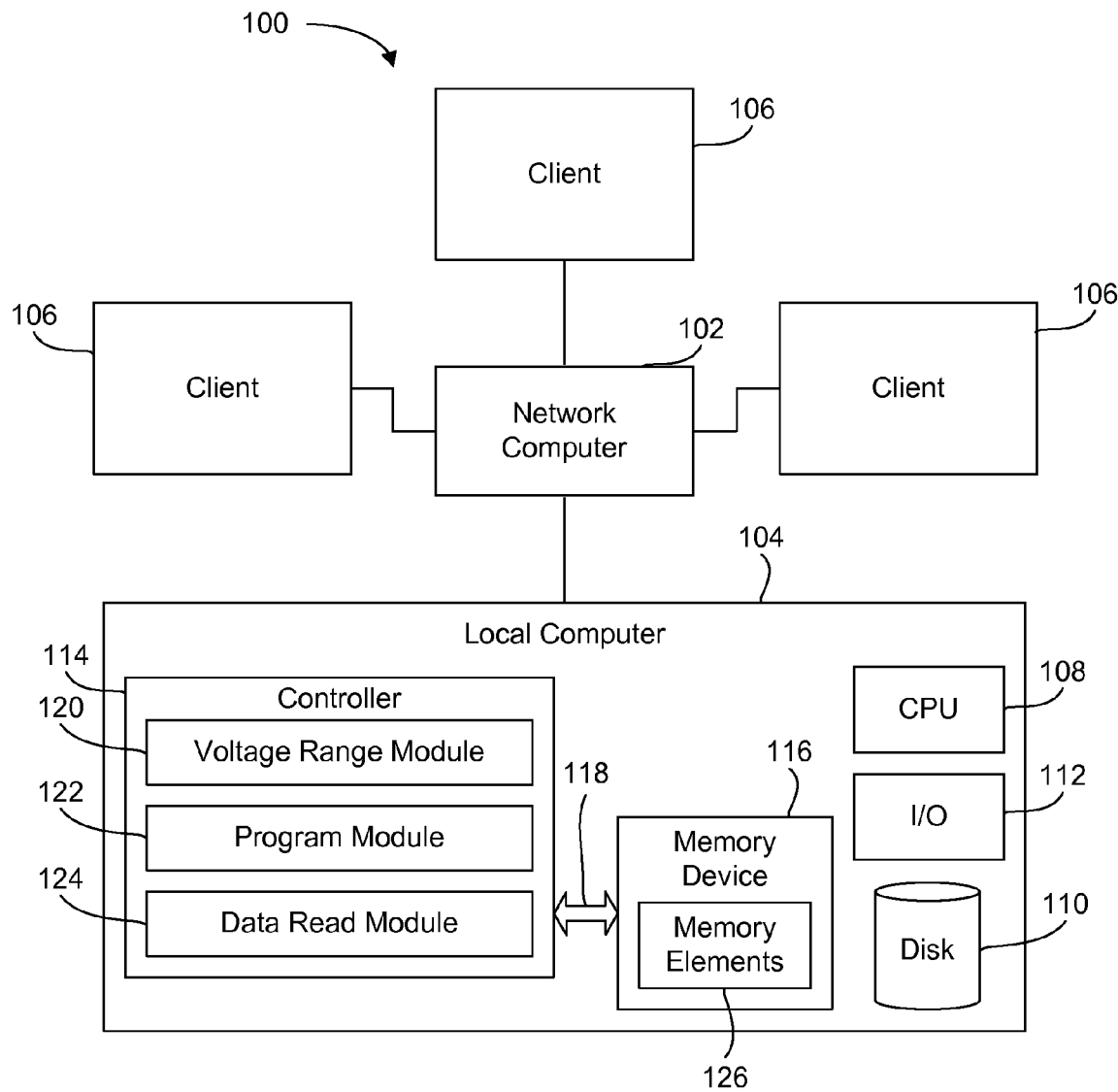
FIG. 1 depicts a schematic diagram of one embodiment of a network system which includes a local computer having a controller for a memory device.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Reference to a computer readable medium may take any physical form capable of storing machine-readable instructions, at least for a time in a non-transient state, on a digital processing apparatus. A computer readable medium may be embodied by a compact disk, digital-video disk, a blu-ray disc, a magnetic tape, a Bernoulli drive, a magnetic disk, flash memory, integrated circuits, or other digital processing apparatus memory device.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments present an apparatus and method for adaptive voltage range management in non-volatile memory. Specifically, the apparatus provides a controller for managing a voltage range for an electronic memory device. The controller adjusts the voltage range according to program/erase cycles, read cycles, bit error rate (BER), device characteristics for the memory device to take advantage of the accuracy or integrity of the memory device. In one embodiment, the accuracy or integrity of the device includes an ability of the memory device to store a charge within a specified set of voltages. Degradation in the accuracy of the memory device may result in the memory device being unable to hold a charge within the specified set or range of voltages, which may lead to a higher BER. In some embodiments, the apparatus further uses as much of an error correction capability of the apparatus as possible when adjusting the voltage range to maximize a lifespan of the memory device.

Non-volatile memory devices, such as NAND flash, have a voltage range that helps determine storage levels for programming processes in single-level cell (SLC) or multi-level cell (MLC) memory elements. For example, the voltage range for NAND flash is the range of voltages for a specific memory device that may be used for programming the memory device to programming states. The voltage range may include voltage levels at which the programming states for the memory elements are configured. Different sub-ranges correspond to different storage levels, for processes such as binary-coded SLC or MLC or gray-coded MLC, four such levels are mapped to the voltage range. Between each level or sub-range is a guard band that assures a clean separation of the levels for an adequate signal-to-noise ratio (SNR). The programming processes may also be configured according to an incremental step pulsed programming (ISPP) approach, in which a memory element may be programmed to the desired voltage using small, incremental steps, which may help prolong the life of the memory element.

As a memory device ages, various leakage phenomena combine to spread charge distributions in each stored level, such that the guard band that separates the stored signals shrinks. However, for practical purposes, there is a fixed maximum voltage at which charge that may be stored in cells according to either physical capabilities of the memory elements or manufacturer specified maximum voltages for the memory elements. This constraint in part defines end-of-life for non-volatile memory; as sub-ranges become blurred due to leakage, SNR drops to the point that the uncorrectable BER (UBER) or other reliability requirements are not met.

In contrast, when a device is new, the maximum voltage range at which the memory device is able to store voltages is greater than later in the life of the memory device when the memory device is more "stressed" or "worn". Charge levels are well defined and distinct, guard bands are large, and the raw BER (RBER) is minimal. In other words, there is an excess margin in the design at certain points in the device life, or during certain periods or under certain conditions of device use.

In the case of NAND flash, the maximum voltage range of a device is constrained because placing more charge in cells causes excessive accumulated damage and signal loss, for example through charge accumulation/trapping. Programming NAND flash cells to higher levels of charge near the upper end of the voltage range is the most damaging. By deliberately reducing the voltage range of NAND flash through modification of program and read voltage thresholds, as indicated by device characteristics such as usage statistics related to age, measured error rates, reads/writes, and other factors, accumulated wear may be minimized and the useful life of the device may be extended. In an embodiment of a memory device using ISPP, this may include changing the magnitude, number, and duration of the steps.

In some embodiments described herein, a method is presented for adaptive voltage range management in non-volatile memory. An embodiment of the method includes establishing an adaptive voltage range for a memory element of an electronic memory device. The memory element comprises at least two states, and the adaptive voltage range comprises a lower state and an upper state. The method also includes establishing an adjustment process to implement a first adjustment of an abode characteristic of a first state and to implement a second adjustment of an abode characteristic of a second state in the adaptive voltage range in response to a trigger event. The first adjustment of an abode characteristic of the first state is different from the second adjustment of an abode characteristic of the second state. The adjustments may be different in terms of different parameters applied to the same abode characteristic for each state, or the same or different parameters applied to different abode characteristics of each state.

In further embodiments, adjusting the abode characteristics further includes adjusting voltage boundaries for each of the first state and the second state according to asymmetric adjustment factors. In further embodiments, adjusting the abode characteristics further includes compressing the adaptive voltage range and adjusting the lower state and the upper state to fit in the compressed adaptive voltage range. In further embodiments, adjusting the abode characteristics further includes expanding the adaptive voltage range beyond a default voltage range, adjusting the lower state and the upper state to fit in the expanded adaptive voltage range, and adjusting a read voltage for unselected word lines (Vpass) to a voltage level that is higher than a default voltage level of Vpass. In further embodiments, the method also includes adjusting the abode characteristics by shifting the first state to a different voltage level from an initial voltage level for the first state, while retaining the second state at an initial voltage level for the second state, and adjusting a read threshold voltage for the first state in conjunction with the different voltage level of the first state.

Another embodiment of a method for managing memory includes operating a memory element of an electronic memory device in an adaptive voltage range. The memory element comprises at least two states, including a lower state and an upper state. The method also includes implementing a first adjustment of an abode characteristic of a first state in the adaptive voltage range, in response to a trigger event. The method also includes implementing a second adjustment of an abode characteristic of the second state in the adaptive voltage range, in response to the trigger event. The first adjustment of the abode characteristic of the first state is different from the second adjustment of the abode characteristic of the second state.

In further embodiments, the method also includes applying asymmetric adjustment factors to the first state and the second state by adjusting voltage boundaries for each of the first state and the second state according to asymmetric adjustment factors. In further embodiments, the method also includes adjusting an adaptive voltage range of the memory element. In further embodiments, adjusting the adaptive voltage range further includes compressing the adaptive voltage range and adjusting the lower state and the upper state to fit within the compressed adaptive voltage range. In further embodiments, adjusting the adaptive voltage range further includes expanding the adaptive voltage range and adjusting the lower state and the upper state to fit within the compressed adaptive voltage range.

Another embodiment of the method includes establishing alternative first and second programming processes for a memory element of an electronic memory device. The first programming process includes at least two programming states, including the erase state and at least one other programming state. The second programming process includes the erase state and at least one other programming state that is different from the programming state of the first programming process. The programming states are configured to represent a common bit quantity and are different from each other in at least one aspect. The method also includes establishing a trigger event related to a device characteristic of the electronic memory device. The method also includes establishing a monitoring process to monitor the device characteristic of the electronic memory device for transition from the first programming process to the second programming process in response to recognition of the trigger event. In some embodiments, the method also includes providing the first and second programming processes and the monitoring process to an end user for initiation of the transition during operation of the electronic memory device by the user.

In some embodiments, the common bit quantity is one, and the first and second programming processes are directed to single level cell (SLC) memory elements in which the erase state and the first and second programming states are each representative of a single bit of data. In an embodiment which uses SLC memory elements, the programming state of the second programming process has different abode characteristics (e.g., a wider range or distribution) than the corresponding programming state of the first programming process. The range or distribution of the programming state is between a lower voltage boundary and an upper voltage boundary of the programming state.

In some embodiments, the common bit quantity is greater than one, and the first and second programming processes are directed to multi level cell (MLC) memory elements (e.g. two, three or more bits per cell) in which the erase state and the first and second programming states are each representative of at least two bits of data. In an embodiment which uses MLC memory elements, the programming state of the second programming process has different abode characteristics (e.g., a wider range or distribution) than the corresponding programming state of the first programming process. The range or distribution of the programming state is between a lower voltage boundary and an upper voltage boundary of the programming state. In other embodiments, the programming state of the first programming process is closer to a threshold voltage of the MLC memory element than the corresponding programming state of the second programming process. In other embodiments, the first programming process defines a first abode between read thresholds of the programming state, and the second programming process defines a second abode between corresponding read thresholds of the corresponding programming state. The second abode of the programming state of the second programming process may be wider than the first abode of the corresponding programming state of the first programming process. Other embodiments of methods are also described.

In some embodiments described herein, an electronic memory device controller is described. In one embodiment, the controller includes a physical interface and a voltage range module. The physical interface is configured to couple the controller to an electronic memory device. The electronic memory device comprises a plurality of memory elements. The voltage range module is coupled to the physical interface. The voltage range module is configured to implement an adaptive voltage range for a memory element of the electronic memory device. The memory element comprises at least two states. The adaptive voltage range comprises a lower state and an upper state. The voltage range module is also configured to implement a first adjustment of an abode characteristic of a first state in the adaptive voltage range, in response to a trigger event. The voltage range module is also configured to implement a second adjustment of an abode characteristic of a second state in the adaptive voltage range, in response to the trigger event. The first adjustment of the first state is different from the second adjustment of the second state. The adjustments may be different in terms of different parameters applied to the same abode characteristic for each state, or the same or different parameters applied to different abode characteristics of each state.

In further embodiments, the voltage range module is further configured to adjust voltage boundaries for each of the first state and the second state according to asymmetric adjustment factors. In further embodiments, the voltage range module is further configured to adjust a width of an abode for each of the first state and the second state asymmetrically, in which an adjustment factor applied to the first state is unequal to an adjustment factor applied to the second state. In further embodiments, implementing the first and second adjustments of the abode characteristics further comprises fine-grained adjustment of a read threshold voltage between the first state and the second state. In further embodiments, the voltage range module is further configured to compress the adaptive voltage range and to adjust the lower state and the upper state to fit in the compressed adaptive voltage range. In further embodiments, the voltage range module is further configured to expand the adaptive voltage range and to adjust the lower state and the upper state to fit in the expanded adaptive voltage range. In further embodiments, the first state is a first programming state and the second state is a second programming state. The first programming state is configured to represent a first bit value and the second programming state is configured to represent a second bit value. In further embodiments, the voltage range module is further configured to adjust the first programming state using first adjustment factors, adjust the second programming state using second adjustment factors (wherein at least one adjustment factor of the second adjustment factors is different from the first adjustment factors), adjust a first read threshold voltage for the first programming state in conjunction with the first adjustment factors, and adjust a second read threshold voltage for the second programming state in conjunction with the second adjustment factors. In further embodiments, the voltage range module is further configured to shift the first programming state to a different voltage level from an initial voltage level for the first programming state while retaining the second programming state at an initial voltage level for the second programming state. In further embodiments, the voltage range module is further configured to adjust the read threshold voltage for the first programming state in conjunction with the different voltage level of the first programming state. In further embodiments, the voltage range module is further configured to expand the adaptive voltage range beyond a default voltage range and adjust a verify threshold voltage for unselected word lines (Vpass) to a voltage level that is higher than a default unselected word line voltage level.

In other embodiments, the voltage range module is configured to implement an adaptive voltage range for a memory element of the electronic memory device, the memory element comprising at least two states, wherein the adaptive voltage range comprises a lower state and an upper state, shift at least two states corresponding to the adaptive voltage range from a first set of voltage levels to a second set of voltage levels in response to a trigger event, and maintain a width of a guard band between the at least two states at the second set of voltage levels equal to the width of the guard band between the at least two states at the first set of voltage levels. In further embodiments, the voltage range module is further configured to retain constant abode characteristics for at least one additional state of the at least two states. In further embodiments, the voltage range module is further configured to shift read threshold voltages for the at least two states to the second set of voltage levels, maintain abode widths for the at least two states from the first set of voltage levels to the second set of voltage levels, and shift voltage boundaries for the at least two states. In further embodiments, the voltage range module is further configured to monitor a device characteristic of the electronic memory device for the trigger event and shift the at least states to higher voltage levels on a voltage scale in response to the trigger event.

Another embodiment of the controller includes a physical interface and a voltage range module. The physical interface is configured to couple the controller to an electronic memory device, which includes a plurality of memory elements. The voltage range module is coupled to the physical interface. The voltage range module is configured to implement a first programming process for a memory element of the electronic memory device. The first programming process may be configured to utilize an erase state and at least one other programming state. The voltage range module is also configured to monitor a device characteristic of the electronic memory device for a trigger event. The voltage range module is also configured to transition, in response to the trigger event, from the first programming process to a second programming process. The second programming process may be configured to utilize the erase state and at least one other programming state that is different in at least one aspect from the corresponding programming state of the first programming process. The programming states are configured to represent a common bit quantity.

In some embodiments, the first programming process comprises a first single level cell (SLC) programming process, and the second programming process comprises a second SLC programming process. The voltage range module is further configured to transition from the first SLC programming process to the second SLC programming process. In one embodiment, the programming state of the second SLC programming process is wider than the corresponding programming state of the first SLC programming process. In another embodiment, the programming state of the first SLC programming process is closer to a natural threshold voltage of the memory element than the corresponding programming state of the second SLC programming process.

In some embodiments, the first programming process includes a first multi level cell (MLC) programming process, and the second programming process includes a second MLC programming process. The voltage range module is further configured to transition from the first MLC programming process to the second MLC programming process. In other embodiments, the programming state of the second MLC programming process is wider than the corresponding programming state of the first MLC programming process. In other embodiments, the programming state of the first MLC programming process is closer to a natural threshold voltage of the memory element than the corresponding programming state of the second MLC programming process. In other embodiments, the first MLC programming process defines a first abode between read thresholds of the programming state, and the second MLC programming process defines a second abode between read thresholds of the corresponding programming state. The second abode of the MLC programming state of the second programming process may be wider than the first abode of the MLC programming state of the second programming process.

In some embodiments, the voltage range module is further configured to monitor for a trigger event in the form of a signal-to-noise ratio (SNR) which causes a bit error rate (BER) to exceed an error threshold. In some embodiments, the voltage range module is further configured to monitor for the trigger event in the form of a program/erase (P/E) cycle count exceeding a P/E threshold. Other embodiments of the controller are also described.

Embodiments of a method for configuring an electronic memory device to utilize error correcting code (ECC) are also described. In one embodiment, the method includes establishing a first programming process for a memory element of the electronic memory device. The first programming process is configured to utilize a first value for a programming parameter to maximize a first signal-to-noise ratio (SNR) with an associated first bit error rate (BER) and a first ECC utilization rate during a first read operation. The method also includes establishing a second programming process for the memory element of the electronic memory device. The second programming process is configured to utilize a second value for the programming parameter to achieve a second SNR, which is lower than the first SNR, with an associated second BER and a second ECC utilization rate, which are higher than the first BER and the first ECC utilization rate.

In some embodiments, the first and second ECC utilization rates each represent a ratio between an amount of ECC processing resources utilized and an amount of ECC processing resources available for utilization with the memory element. In some embodiments, the ECC processing resources comprise only hardware ECC processing resources. Other embodiments may include software and/or firmware ECC processing resources. In some embodiments, the programming parameter includes a voltage range inclusive of at least one programming voltage for a corresponding programming state. In at least one embodiment, the voltage range includes a plurality of programming voltages for a corresponding plurality of programming states, in which case the memory element is programmed in a multi level cell (MLC) programming mode.

In further embodiments, the method also includes switching from the first programming process to the second programming process to achieve a faster programming time to program the memory element, and to rely on the higher first ECC utilization rate to offset the lower second SNR during a read operation of the memory element.

Further embodiments of an electronic memory device controller are also described. In some embodiments, the controller includes a physical interface configured to couple the controller to an electronic memory device, which includes a plurality of memory elements. The controller also includes a voltage range module coupled to the physical interface. The voltage range module is configured to implement a first programming process for a memory element of the electronic memory device. The first programming process is configured to utilize a first value for a programming parameter to maximize a first signal-to-noise ratio (SNR) with an associated first bit error rate (BER) and a first ECC utilization rate during a first read operation. The voltage range module is also configured to monitor a bit error rate (BER) for a plurality of read operations to read data from the electronic memory device. The voltage range module is also configured to transition, in response to a determination that the BER is below a threshold, from the first programming process to a second programming process. The second programming process is configured to utilize a second value for the programming parameter to achieve a second SNR, which is lower than the first SNR, with an associated second BER and a second ECC utilization rate, which are higher than the first BER and the first ECC utilization rate.

In some embodiments, the first and second ECC utilization rates each represent a ratio between an amount of ECC processing resources utilized and an amount of ECC processing resources available for utilization with the memory element. In some embodiments, the ECC processing resources include only hardware ECC processing resources. Alternatively, the ECC processing resources include a combination of hardware and software ECC processing resources. In some embodiments, the programming parameter includes a voltage range inclusive of at least one programming voltage for a corresponding programming state. In at least one embodiment, the voltage range includes a plurality of programming voltages for a corresponding plurality of programming states. The memory element is programmed in a multi level cell (MLC) programming mode. In further embodiments, the voltage range module is configured to transition from the first programming process to the second programming process to achieve a faster programming time to program the memory element, and to rely on the higher first ECC utilization rate to offset the lower second SNR during a read operation of the memory element. Other embodiments of the controller are also described.

FIG. 1 depicts a schematic diagram of one embodiment of a network system 100. The depicted network system 100 includes various components, described in more detail below, that are capable of performing the functions and operations described herein. In one embodiment, at least some of the components of the network system 100 are implemented in a computer system. For example, the functionality of one or more components of the network system 100 may be implemented by computer program instructions stored and executed on a network computer device 102. The network system 100 may include other components, such as a local computer 104 and one or more clients 106. The local computer 104 may include various components, including a processor 108 (such as a CPU), a disk storage device 110, input/output devices 112, a controller 114, and a memory device 116. Some or all of the components of the network system 100 may be stored on a single computing device or on a network of computing devices, including a wireless communication network. The network system 100 may include more or fewer components or subsystems than those depicted herein. In some embodiments, the network system 100 may be used to implement the methods described herein as depicted in FIGS. 7 and 8.

In one embodiment, the controller 114 includes a physical interface 118 configured to couple the controller 114 to the memory device 116. In various embodiments, the controller 114 may be implemented by hardware, firmware, a driver, or other implementations capable of controlling operations in a memory device 116. The memory device 116 includes one or more memory elements 126. The memory device 116 may be used for storing data associated with the local computer 104 and/or the network system 100. Although the local computer 104 is shown with a single memory device 116, other embodiments of the local computer 104 may include more than one memory device 116. Similarly, multiple memory devices 116 may be implemented at various locations within the nodes of the computer network. Embodiments of the network system 100 may provide dedicated or shared memory resources for one or more of the clients 106 and local computer 104, though other implementations of storage/memory resources or capacity may be used in conjunction with the network system 100.

In some embodiments, the memory elements 126 may be SLC, MLC, or TLC memory elements 126 implemented in any type of SLC, MLC, TLC, QLC, or any technology capable of storing a signal or charge representative of multiple bits in a single storage location. In one embodiment, the memory elements 126 are NAND flash memory elements 126 or other solid-state memory elements 126. The memory elements 126 may also be MLC, TLC, or QLC memory elements capable of operating in a single-level cell (SLC) mode. In general, solid-state memory elements 126 can be set to different programmable states that correspond to different bits or bit combinations. In another embodiment, the memory device 116 includes other types of memory elements 126.

In some embodiments, each memory element 126 is a cell that has $2^X$ possible programming states, where X is equal to the number of bits per memory element 126. In one embodiment, each memory element 126 is configured for an intermediate state. For example, a memory element 126 may store two bits of information and, accordingly, have four possible programming states. As another example, a memory element 126 may store three bits of information and, accordingly, have eight possible programming states.

In various embodiments, the memory device 116 may be a non-volatile memory device 116 in the form of a dual-inline memory module ("DIMM"), a daughter card, or a micro-module. In another embodiment, the memory device 116 is an element within a rack-mounted blade. In another embodiment, the memory device 116 is contained within a package that is integrated directly onto a higher level assembly (e.g., mother board, laptop, graphics processor, etc.). In another embodiment, individual components including the memory device 116 are integrated directly onto a higher level assembly without intermediate packaging.

The illustrated controller 114 may include a voltage range module 120, a program module 122, and a data read module 124. In one embodiment, the program module 122 programs one or more bits of a memory element 126 of the memory device 116. The memory elements 126 may be programmed to different states depending on the desired bit configuration for each memory element 126 according to the voltage range configuration. In one embodiment, the data read module 124 reads at least one data bit within the memory element 126, depending on the configuration of the memory element 126.

In one embodiment, the voltage range module 120 determines a voltage range for the memory elements 126. The voltage range may be used to determine voltage levels at which the memory elements 126 may be programmed to certain states by the program module 122. The voltage range module 120 may determine the voltage range for the memory elements 126 based on device characteristics of the memory elements. In one embodiment, the device characteristics include usage statistics of the memory elements 126. The voltage range is modified according to the usage statistics to minimize damage caused by high levels of charge injection. In various embodiments, the usage statistics may include program/erase (P/E) cycle counts per erase block (EB), BER (as well as the RBER or UBER), typical application temperature, and/or other usage statistics. In another embodiment, the device characteristics include the geometric size of the memory element 126 (e.g. 24 nanometers (nm), 21 nm, 32 nm, etc.), the manufacturer, the number of failed cells or other physical or inherent characteristics of the memory element 126.

In one embodiment, the voltage range module 120 is configured to set the voltage range corresponding to the programming states. The voltage range module 120 may monitor the BER for the memory device 116 and adjust the voltage range in a closed-loop fashion to use as much of the error correction capability for the memory device 116 as possible. In some embodiments, the error correction capability may include hardware, software, and/or firmware error correction. The error correction capability of the hardware error correction may be a fixed error correction capability. Thus, the voltage range module 120 may adjust the voltage range such that the BER for the memory device 116 increases to use more error correction capability.

In some embodiments, the voltage range may be compressed until the BER is approximately equal to a maximum error correction capability of the memory device 116. Compressing the voltage range may also include positioning the compressed range at lower voltage values for the memory element 126. Placing the compressed voltage range at the lower voltage values may place less stress on the memory element 126 and help prolong the life of the memory element 126. The voltage range may be expanded in response to degradation of the accuracy of the memory device 116. The accuracy degradation may be determined by monitoring the BER for P/E cycles and read cycles.

Figure 2:
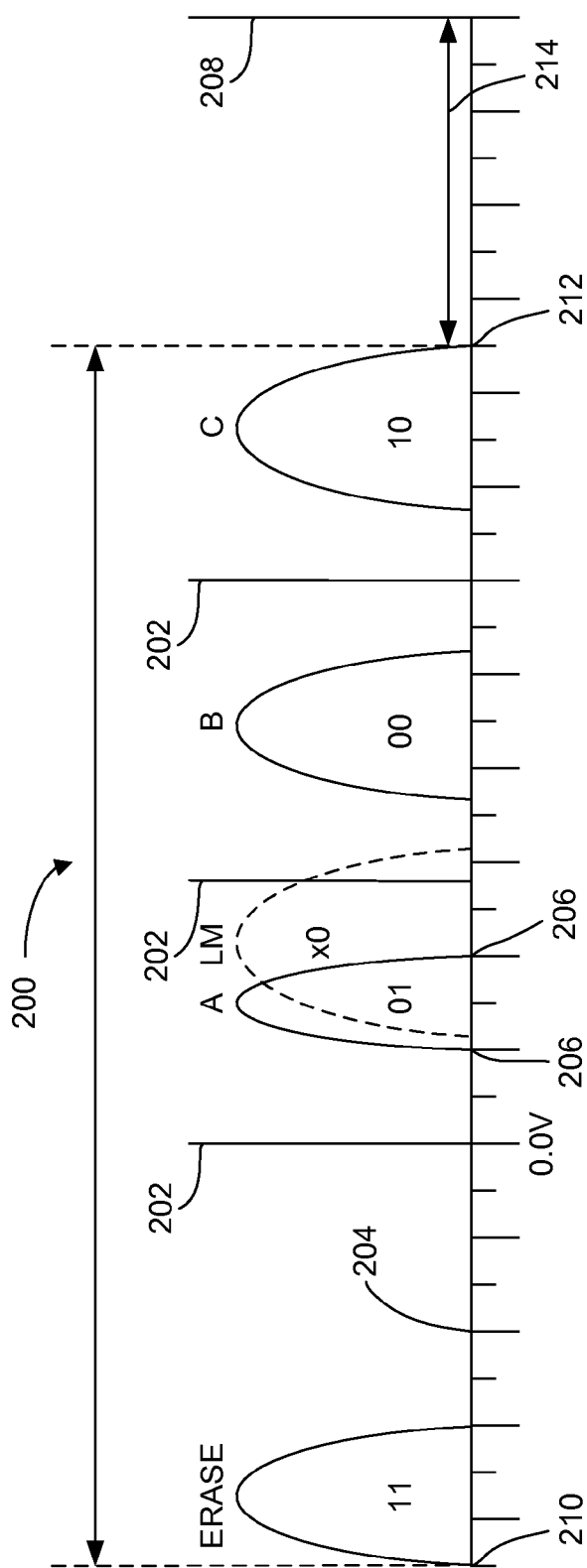
FIG. 2 depicts a graphical diagram of one embodiment of a voltage range for a memory element.

FIG. 2 depicts a graphical diagram of a voltage range 200 for a memory element 126. Memory elements 126 may be designed by a manufacturer to be able to hold a charge within a certain range of voltages. In some embodiments, the memory elements 126 may have an upper voltage limit at which the memory elements 126 are able to effectively hold a charge. This limit may be defined by the manufacturer, physical capabilities of the memory elements 126, the controller 114 or by some other method. An initial voltage range 200 may be set up by the manufacturer. In one embodiment, a memory element 126 is programmable to one or more states. In one embodiment, the voltage range 200 extends from zero volts to some voltage level between zero volts and the upper voltage limit. The voltage range 200 may include programming states at separate voltage levels in the voltage range. Each of the programming states may be determined based on a set of voltage boundaries 206 that define an upper and a lower voltage limit for each of the programming states.

In one embodiment, the programming states include five programming states—A, B, C, an intermediate state LM, and an ERASE state. Programming the memory element 126 to one of the programming states may include storing a charge in the memory element 126 within the voltage boundaries 206 of the specified state. The memory element 126 may be erased by transitioning to the ERASE state. The arced lines at various voltage values on the voltage scale 204 represent a statistical distribution of voltages for a set of cells of a given state once a programming operation is completed. Arced lines for A, B, and C states represent the possible states cells can take on when multiple bits of a MLC cell are programmed. In one embodiment, the voltage range 200 is defined as inclusive of the lowest programming state, such as the ERASE state, and the highest programming state—in this embodiment, state C. Consequently, as the voltage range 200 changes, the programming states change.

In one embodiment, the memory elements 126 may have a read threshold for unselected word lines 208 (also referred to as Vpass 208) in the memory elements 126. In general, the Vpass 208 is a voltage level that is applied to memory elements in each unselected row (i.e., word line) so that the memory elements of a selected row can pass a read value from a single memory element out to a decoder. Typically, Vpass 208 is the voltage level applied to all of the memory elements in all of the rows, except for the memory elements in the selected row that is to be read out. The Vpass 208 is at a voltage level higher than an upper tail 212 of the highest programming state, which increases the buffer 214 for the upper tail 212 of the highest programming state. Overlap between the upper tail 212 of the highest programming state and the Vpass 208 may cause failures in the memory elements 126.

Figure 3:
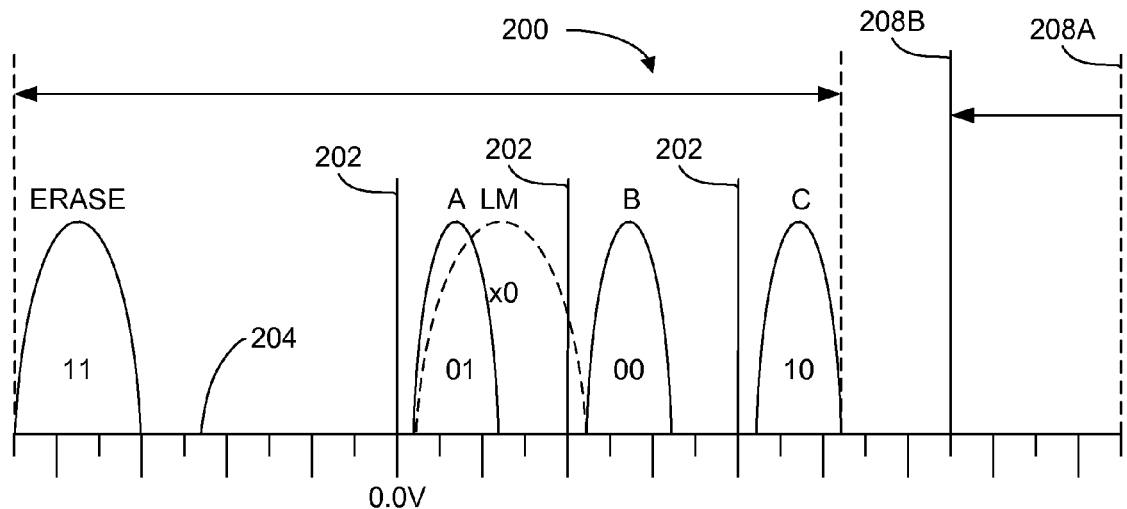
FIG. 3 depicts a graphical diagram of one embodiment of a voltage range for a memory element.

FIG. 3 depicts a graphical diagram of one embodiment of a voltage range 200 for a memory element 126. While the controller 114 of FIG. 1 is described herein in conjunction with the memory device 116 for the voltage range 200 shown in FIG. 3, the controller 114 may be used in conjunction with any memory device 116.

Each programming state includes a range of voltages, which correspond to the voltage scale 204 represented by the horizontal axis. In one embodiment, voltage values to the left of 0.0V (corresponding to zero volts on the voltage scale 204) are negative voltages, and voltages to the right are positive voltages. Other conventions may be used to designate the voltages.

When the memory element 126 is new, the voltage range 200 corresponding to the memory element 126 may be compressed and positioned at lower voltage levels on the voltage scale 204 to take advantage of the high accuracy/integrity of the memory element 126. The compressed voltage range 200 may be used while the number of P/E cycles for the memory element 126 is between zero and an initial threshold. The voltage range 200 for each of the memory elements 126 may be compressed and positioned by the voltage range module 120 at lower voltage levels during an initialization or first startup of the memory device 116. For example, for a first stage of the memory element 126, the statistical distribution of voltages corresponding to the ERASE state spans from about −2.25V to about −1.5V. The statistical distribution of voltages corresponding to each of the other programming states may span a range of about 0.5V—state A spans from about 0.2V to about 0.7V; state B spans from about 1.2V to about 1.7V; and state C spans from about 2.2V to about 2.7V. The LM state may span from about 0.25V to about 1.25V or to similar voltage levels. In other embodiments, the spans may be different and may start or end at different voltages. The read threshold levels 202 are also displayed for the voltage range 200 between each programming state. The voltage difference between the read threshold levels 202 are referred to herein as the abodes. As the read threshold levels 202 change, the abodes are lengthened or compressed accordingly.

In one embodiment, the voltage level corresponding to the verify threshold voltage 208 for the unselected word lines is lowered during a compressed state for the voltage range 200 to a lower voltage level than an initial setting while still maintaining a sufficient buffer 214 for the upper tail 212 of the voltage boundaries 206 of the highest programming state C. As shown in FIG. 3, the verify threshold voltage 208 may be moved from a first verify threshold voltage level 208A to a second verify threshold voltage level 208B. For example, the voltage level of the verify threshold voltage 208 while the memory element 126 is in a compressed state may be at about 4 volts. Lowering the verify threshold voltage 208 for the unselected word lines may help prevent read disturb in the unselected word lines, which can effect saved data in the unselected memory elements 126.

The intermediate state may also be referred to as the low-to-middle (LM) state because it is between state A and state B on the voltage scale 204, in the present embodiment, and because the LM state is a possible state after programming a lower page and before programming an upper page of the memory element 126. In the illustrated embodiment, the intermediate LM state spans from about 0.2V to about 1.2V, although other embodiments may use other statistical distribution of voltages for the intermediate LM state.

The term "programming states" is used herein to refer to the group of all states which are available for programming based on a design and implementation for each memory element 126. For example, FIG. 1 includes at least four programming states (A, B, C, and ERASE), each of which is operational to maintain a programming state corresponding to a value for a bit (or values for multiple bits) of data. In some embodiments, an LM state serves as a fifth programming state, for maintaining a programming state corresponding to one or more bit values. In alternative embodiments, the programming states may exclude the LM state and/or the ERASE state. In another embodiment, the programming states are defined to include states in the positive voltage range V0-Vmax (e.g., A, B, C, and LM), while excluding states in the negative voltage range (e.g., ERASE). In some embodiments the adaptive dynamic range of a memory element may be defined to include only the states which are designated as programming states. Consequently, in some embodiments the adaptive dynamic range of a memory element may be defined to include only the states in a positive voltage range.

In the illustrated embodiment, the ERASE state represents a bit combination 11, and states A-C represent bit combinations 01, 00, and 10 (from the lowest voltage range to the highest voltage range), respectively. In this convention, the left bit is the most significant bit (MSB), and the right bit is the least significant bit (LSB). The intermediate state is designated as x0 according to the present embodiment to indicate that the LSB is set to zero, but the MSB is not yet set to a specific bit value.

Figure 4:
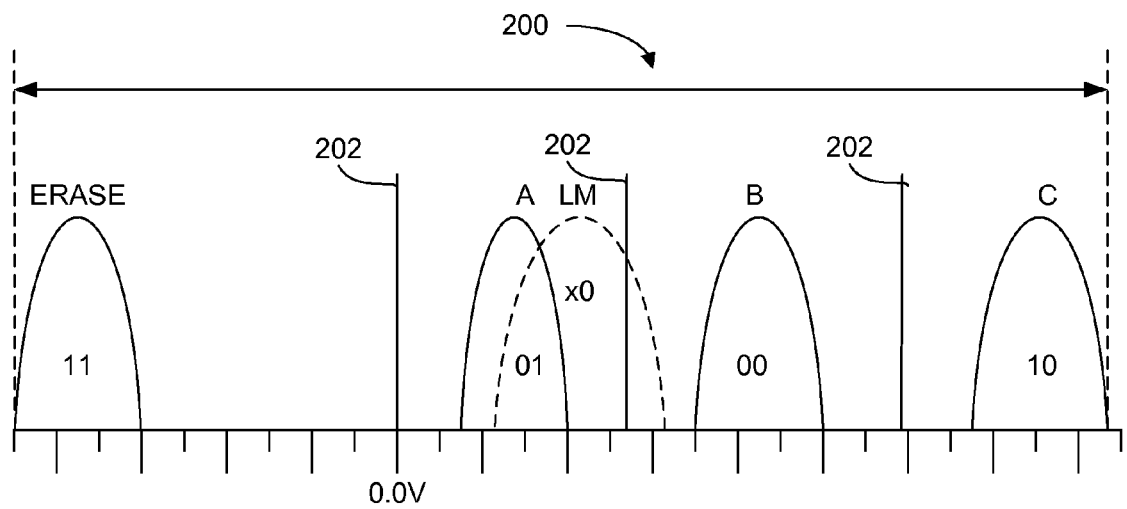
FIG. 4 depicts a graphical diagram of one embodiment of a voltage range for a memory element.

FIG. 4 depicts a graphical diagram of one embodiment of a voltage range 200 for a memory element 126. The voltage range 200 depicted in FIG. 3 may correspond to a second stage for the memory element 126. When the memory element 126 has gone through a certain number of P/E cycle counts, for example, the accuracy of the memory element 126 may degrade, such that the compressed voltage range 200 shown in FIG. 2 results in a higher BER. In one embodiment, a first stage may be set for 0-1500 P/E cycle counts, a second stage may be set for 1501-5000 P/E cycle counts, a third stage may be set for 5001-10,000 P/E cycle counts, and a fourth stage may be set for 10,001-15,000 P/E cycle counts. Other embodiments may include stages with different ranges of P/E cycle counts. For example, the stages may include P/E cycle counts in more ranges, fewer ranges, larger ranges, or smaller ranges. The P/E cycle counts may go higher than described herein. The stages of P/E cycle counts may be set depending on factors such as error correction strength, retention requirements, or others factors. In response, the voltage range 200 corresponding to the memory element 126 may be expanded or shifted to a different position on the voltage scale 204 to accommodate the lower accuracy. The voltage range 200 is expanded when a given threshold is met corresponding to a predetermined P/E cycle count, BER, or other device characteristics.

In one embodiment, the second stage of the voltage range 200 for the memory element 126 may correspond to an original equipment manufacturer (OEM) configuration. In one embodiment, adjustment of the voltage range 200 for the memory element 126 does not change the statistical distribution of voltages corresponding to the ERASE state which may span from about −2.25V to about −1.5V. Of course, the statistical distribution of voltages for the ERASE state may change or drift over naturally to higher voltages, through use of the memory element 126. The statistical distribution of voltages corresponding to state A spans from about 0.5V to about 1.0V; state B spans from about 1.85V to about 2.35V; and state C spans from about 3.5V to about 4.0V. In other embodiments, the spans may be different and may start or end at different voltages.

In the illustrated embodiment, the intermediate LM state spans from about 0.6V to about 1.6V, although other embodiments may use other statistical distribution of voltages for the intermediate LM state.

As the voltage range 200 for the memory element 126 expands, the statistical distribution of voltages for the programming states becomes more spread out, changing the programming settings for the memory element 126. Additionally, the read threshold levels 202 for each programming state change accordingly, thereby modifying the read threshold settings. In some embodiments, as the voltage range 200 changes, the read threshold levels 202 change relative to the upper and lower bounds of the voltage range 200. In other embodiments, the read threshold levels 202 may change to levels determined by other criteria.

Figure 5:
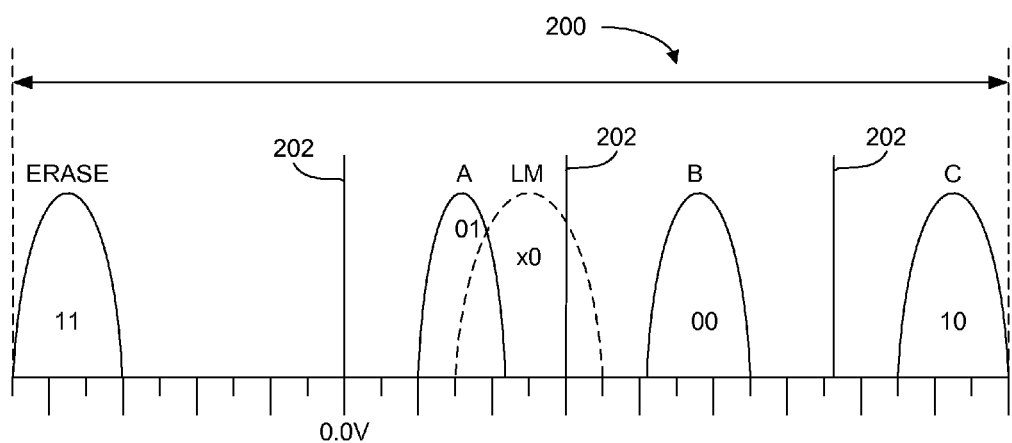
FIG. 5 depicts a graphical diagram of one embodiment of a voltage range for a memory element.

FIG. 5 depicts a graphical diagram of one embodiment of a voltage range 200 for a memory element 126. The voltage range 200 depicted in FIG. 5 may correspond to a third stage for the memory element 126. When the memory element 126 has gone through a certain number of additional P/E cycle counts, as described in the example of FIG. 4, the accuracy of the memory element 126 may further degrade, such that the voltage range 200 shown in FIG. 3 results in a higher BER. In response, the voltage range 200 corresponding to the memory element 126 may be expanded a second time to accommodate the lower accuracy. In one embodiment, the voltage range 200 is expanded for each memory element 126 within an erase block. The erase block may include any number of memory elements 126, for example, up to 1000 memory elements 126. The memory elements 126 in the erase block may be erased as a group, and may be evaluated together when the memory elements 126 are erased, such that when one or more of the memory elements 126 is determined to degrade beyond a certain threshold, the voltage range 200 for all the memory elements 200 in the given erase block is expanded. In one embodiment, the voltage range 200 for each memory element 126 in a block is changed by modifying settings internal to the memory device 116. These changes may be done at any time there is no existing data stored in the memory elements 126 or when data currently stored in the memory elements 126 does not need to be retained (because it has been deleted, invalidated, or copied to a new location).

In one embodiment, the statistical distribution of voltages corresponding to the ERASE state does not change, and thus spans from about −2.25V to about −1.5V. The statistical distribution of voltages corresponding to state A spans from about 0.7V to about 1.2V; state B spans from about 2.2V to about 2.7V; and state C spans from about 4.0V to about 4.5V. In other embodiments, the spans may be different and may start or end at different voltages. The voltage boundaries 206 for the states, including the ERASE state, may move up in voltage level along the voltage scale 204 over time due to use of the memory element 126, and the range of voltages included in the adaptive voltage range 200 may increase.

In the illustrated embodiment, the intermediate LM state spans from about 0.8V to about 1.8V, although other embodiments may use other statistical distribution of voltages for the intermediate LM state.

Figure 6:
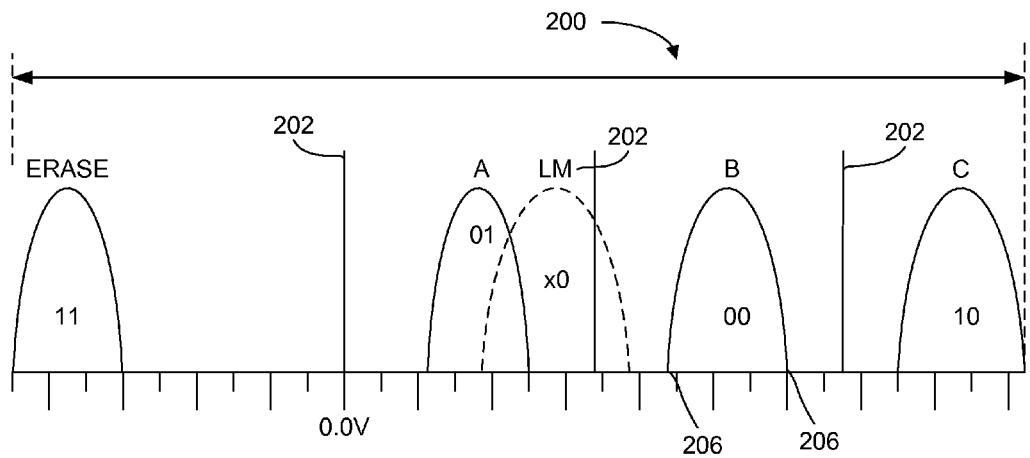
FIG. 6 depicts a graphical diagram of one embodiment of a voltage range for a memory element.

FIG. 6 depicts a graphical diagram of one embodiment of a voltage range 200 for a memory element 126. The voltage range 200 depicted in FIG. 6 may correspond to a fourth stage for the memory element 126. When the memory element 126 has gone through a certain number of additional P/E cycle counts, for example, the accuracy of the memory element 126 may further degrade, such that the voltage range 200 shown in FIG. 3 results in a higher BER. In response, the voltage range 200 corresponding to the memory element 126 may be expanded a third time to accommodate the lower accuracy.

In one embodiment, the statistical distribution of voltages corresponding to the ERASE state does not change, and thus spans from about −2.25V to about −1.5V. The statistical distribution of voltages corresponding to state A spans from about 0.8V to about 1.7V; state B spans from about 2.4V to about 3.3V; and state C spans from about 4.2V to about 5.0V. In other embodiments, the spans may be different and may start or end at different voltages.

In the illustrated embodiment, the intermediate LM state spans from about 0.9V to about 1.9V, although other embodiments may use other statistical distribution of voltages for the intermediate LM state.

In one embodiment, as the voltage range 200 changes, the voltage boundaries 206 associated with the programming states may change. For example, as the voltage range 200 expands with the degradation of the memory element 126, the distance between the voltage boundaries 206 for each programming state may also expand, resulting in a wider range of voltages for each programming state and wider permitted distribution curves for the programming states.

Figure 7A:
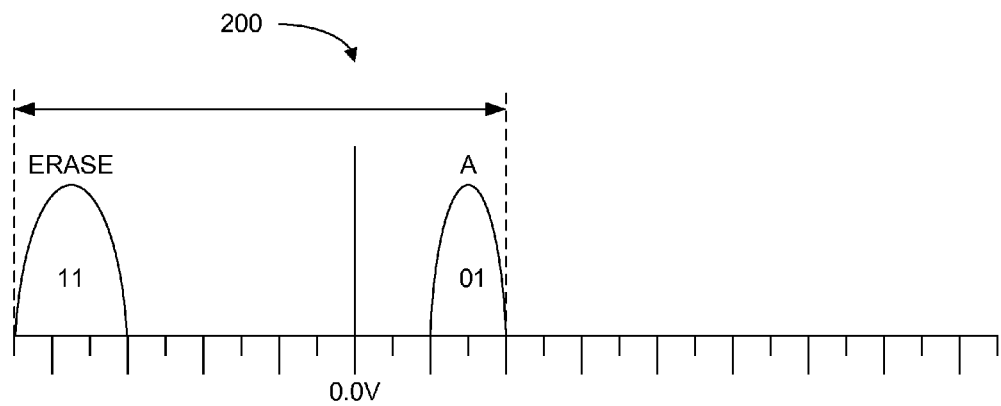
FIGS. 7A-7C depict graphical diagrams of various embodiments of a voltage range for a memory element.
Figure 7B:
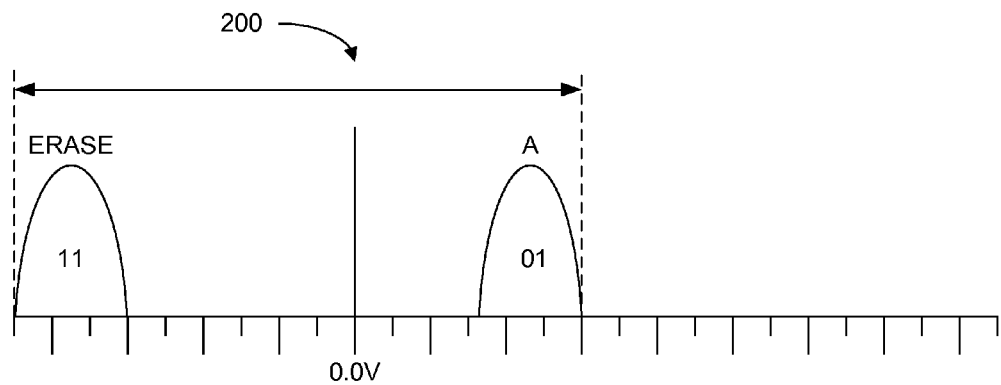
Figure 7C:
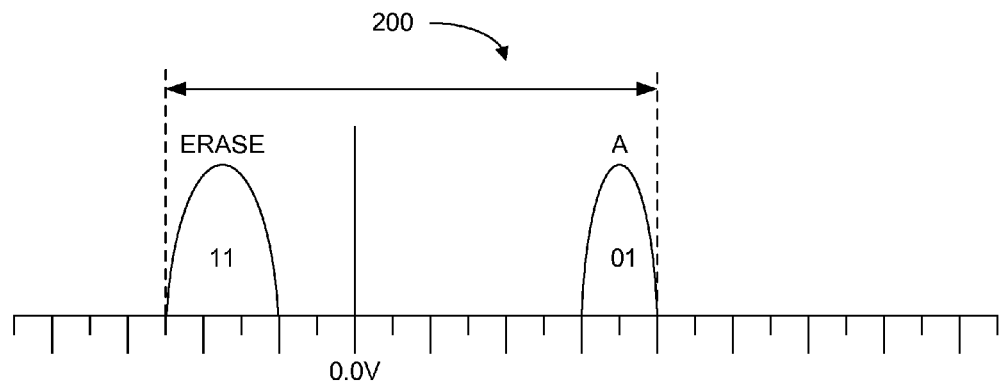
Figure 8:
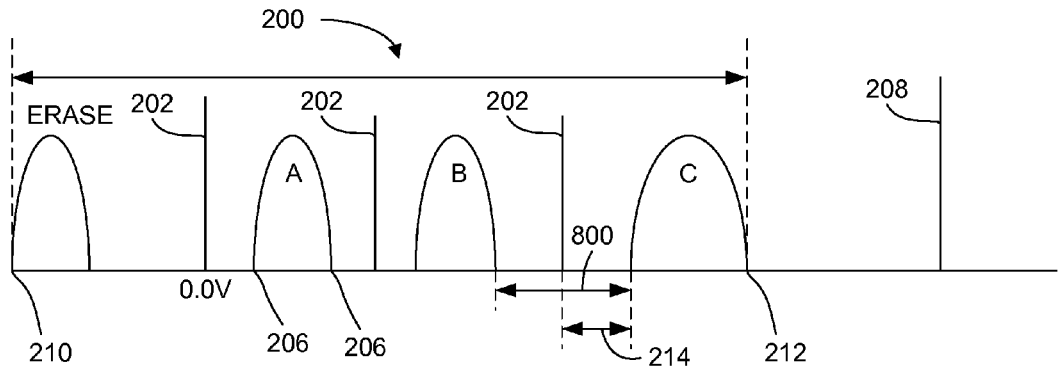
FIG. 8 depicts a graphical diagram of one embodiment of a voltage range for a memory element.

FIGS. 7A-7C depict graphical diagrams of various embodiments of a voltage range 200 for a memory element 126. In one embodiment, when usage statistics or other device characteristics (used by the controller 114 as the threshold for determining when to expand the voltage range 200) have reached a predetermined value, the MLC memory elements 126 may be converted to SLC mode, as shown in FIG. 7A.

For a memory device 116 that is configured to operate in a MLC mode, the controller 114 provides functionality to utilize the memory elements 126 in either a MLC mode or a SLC mode. Consequently, when the device characteristics for determining the voltage range 200 of a memory element 126 passes a certain threshold, the memory element 126 may be converted from the MLC mode to the SLC mode. In certain embodiments, the program module 122 programs the memory element 126 in a SLC mode so that the memory element 126 stores a single bit of data. This may further prolong the life of the memory element 126 once the accuracy of the memory element 126 is no longer sufficient for operating in MLC mode. In some embodiments, the P/E cycle count for the memory element 126 operating in SLC mode may be extended dramatically under certain conditions. Operating the MLC memory elements 126 in the SLC mode is described in further detail in U.S. patent application Ser. No. 13/175,637, which is herein incorporated for all it contains.

In an alternative embodiment, the memory elements 126 may be configured to operate exclusively in SLC mode. An alternative embodiment of the method includes establishing an adaptive voltage range for a memory element operating in SLC mode. The memory element comprises at least two states (one of which may include the ERASE state), and the adaptive voltage range comprises a lower state and an upper state. The method also includes establishing an adjustment process to implement a first adjustment of an abode characteristic of a first state and to implement a second adjustment of an abode characteristic of a second state in the adaptive voltage range in response to a trigger event. Thus, embodiments described herein do not necessarily require a transition from MLC mode to SLC mode in order to implement adjustments to abode characteristics of one or more of the programming states.

The embodiment of FIG. 7B shows a voltage range 200 for a memory element 126 operating in SLC mode for which the distribution of voltages for state A is shifted to the right along the voltage scale 204 and widened, while the distribution of voltages for the ERASE state are not modified by the controller 114. In one embodiment, shown in FIG. 7C, the voltage range 200 may be shifted along the voltage scale 204 such that state A and the ERASE state are shifted along the voltage scale 204. In such an embodiment, the width of the voltage range 200 and the width of the voltage distributions for each of the states may not change substantially.

FIG. 8 depicts a graphical diagram of one embodiment of a voltage range 200 for a memory element 126. In one embodiment, the voltage range 200 is an initial voltage range at an initial or first set of voltage levels, for example a voltage range set by a manufacturer of the memory element 126. The initial voltage range may include programming states that have voltage boundaries 206 and read threshold voltages 202 set at voltage levels that provide a large guard band 800 and buffer 214 for errors. In one embodiment, the guard band 800 is the voltage difference between voltage boundaries 206 of neighboring states, and the buffer 214 is the distance between each voltage boundary 206 and the neighboring read thresholds 202 (or, between the upper tail 212 of state C and the Vpass 208). The voltage range module 120 may modify the voltage range 200 to be different than the initial voltage range according to device characteristics. The voltage range 200 may be modified several times over the life of the memory element 126 by compressing or expanding the voltage range 200 using different adjustment factors for the different abodes in the voltage range 200.

Figure 9:
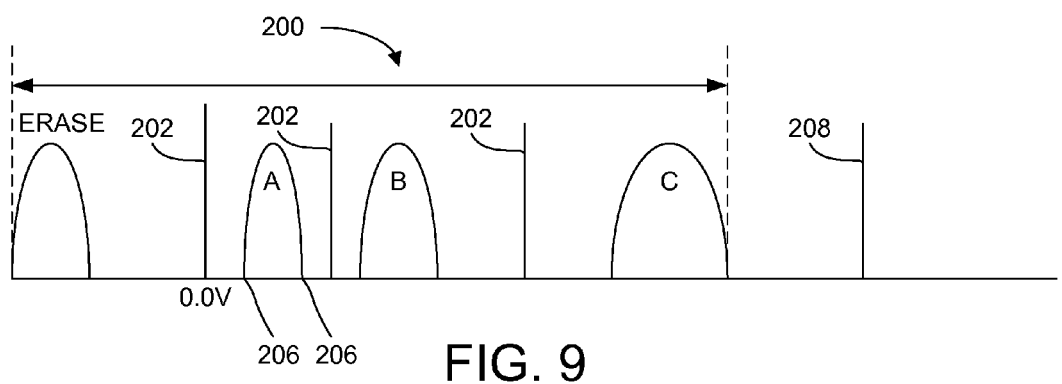
FIG. 9 depicts a graphical diagram of one embodiment of a voltage range for a memory element.
Figure 10:
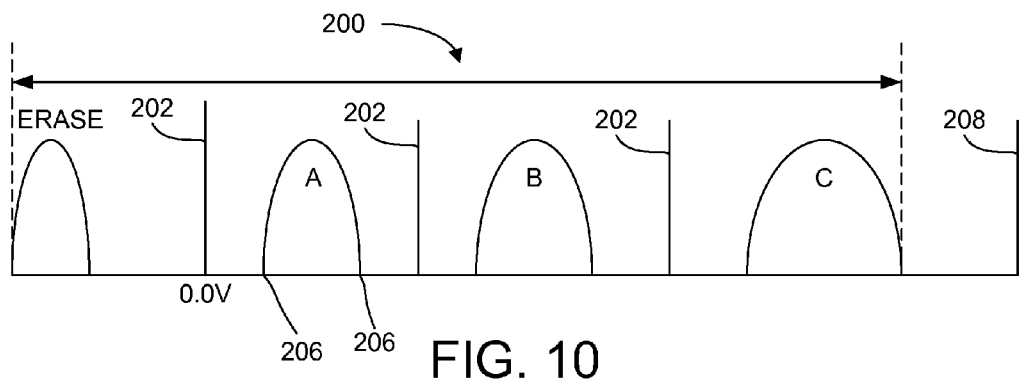
FIG. 10 depicts a graphical diagram of one embodiment of a voltage range for a memory element.
Figure 11:
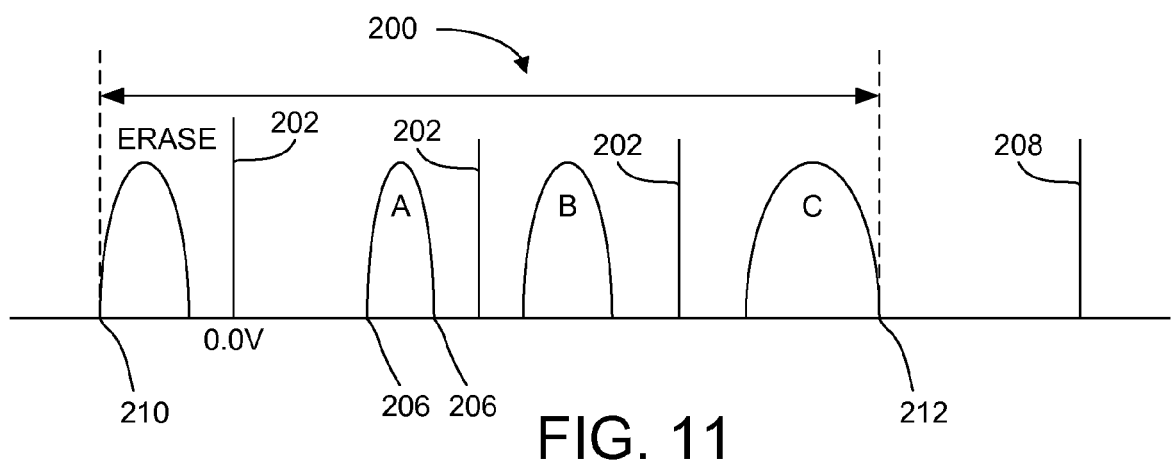
FIG. 11 depicts a graphical diagram of one embodiment of a voltage range for a memory element.

FIG. 9 depicts a graphical diagram of one embodiment of a voltage range 200 for a memory element 126 in a compressed state. FIG. 10 depicts a graphical diagram of one embodiment of a voltage range 200 for a memory element 126 in an expanded state. The voltage range 200 may be compressed such that the programming states fit in a smaller range of voltages. The ERASE state and the upper state C are included in the compressed voltage range 200 and may be adjusted accordingly. The voltage range 200 may alternatively be expanded such that the programming states fit in the larger range of voltages. The ERASE state and the upper state C may be adjusted to the edges of the expanded voltage range 200.

Additionally, the voltage level of the Vpass 208 may be adjusted (e.g., decreased or increased) in order to further mitigate wear on the memory elements 126. In one embodiment, by lowering the Vpass 208, incremental wear from the application of the Vpass 208 to memory elements 126 may be correspondingly reduced because lower applied voltages have less detrimental impact on the characteristics of the individual memory elements 126.

In one embodiment, the voltage range is compressed or expanded using different adjustment factors for at least two of the abodes in the voltage range 200. For example, the voltage range module 120 may compress the abode for one of the programming states at a greater percentage of compression than the abodes for the other programming states. In some embodiments, one or more of the abodes or abode characteristics may be compressed, one or more of the abodes may be expanded, and one or more of the abodes may not be compressed or expanded when the voltage range 200 is compressed by the voltage range module 120. The abode characteristics may include, but are not limited to, the read threshold voltages 202, the voltage boundaries 206 for the programming states, the position of the programming states on the voltage scale 204, the guard band between the programming states, and the buffers between the voltage boundaries 206 of the programming states and the read threshold voltages 202.

When the abodes are adjusted, the voltage boundaries 206 for each of the programming states may be compressed or expanded based on the change in the corresponding abodes. The read threshold voltages 202 for the corresponding programming states and abodes may be adjusted on the voltage scale 204, which may result in changing the width of one or more abodes. The programming states may be moved higher or lower on the voltage scale 204 according to the change in the read threshold voltages 204. The voltage boundaries 206 for each of the programming states may be compressed or expanded according to the change in the read threshold voltages or other abode characteristics.

Compressing or otherwise adjusting any of the abode characteristics using different adjustment factors may result in asymmetric adjustment of the abodes. Asymmetric adjustments allow the programming states, as well as the corresponding read thresholds 202, to be adjusted to provide various programming processes. As used herein, asymmetric adjustments generally refer to making adjustments to at least two states, in which the adjustments are 1) different values directed to the same abode characteristics of the states, or 2) the same or different adjustment values directed to different abode characteristic of the states. Accordingly, asymmetric adjustment factors refer to 1) the different values for the same or different abode characteristics, or 3) the same or similar values for different abode characteristics. In contrast, symmetric adjustments refer to using the same value for the same abode characteristics of different states, and symmetric adjustment factors refer to the same values used in the symmetric adjustments.

As one example, asymmetric adjustment factors may be applied to each state to expand, compress, and/or shift the states to provide larger or smaller guard bands 800 and buffers 214 for various states or to adjust the voltage range 200 to account for current device characteristics of the memory elements 126. Asymmetric adjustments may be made to a voltage range 200 having equal or asymmetric abodes, resulting in asymmetric abodes. Alternatively, asymmetric adjustments may be made to a voltage range 200 having unequal or asymmetric abodes and programming states, resulting in symmetrical abodes. Asymmetric adjustments may be made to a voltage range 200 having asymmetric abodes, resulting in asymmetric abodes.

For example, symmetrical adjustments to the voltage boundaries 206 of each programming state and asymmetric adjustments to the buffers of at least two programming states may result in asymmetric adjustments to the abodes. In another example, asymmetric adjustments to the voltage boundaries 206 of at least two programming states and asymmetric adjustments to the buffers of at least two programming states may result in asymmetric adjustments to the abodes. In another example, asymmetric adjustments to the voltage boundaries 206 of at least two programming states and symmetrical adjustments to the buffers of each of the programming states may result in asymmetric adjustments to the abodes.

Figure 12:
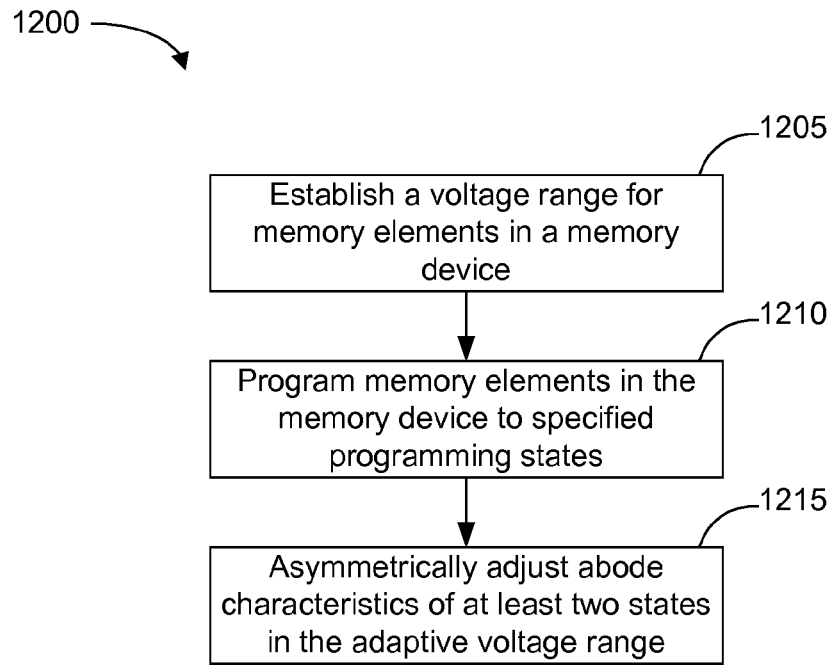
FIG. 12 depicts a flow chart diagram of one embodiment of a method for adaptive voltage range management in non-volatile memory.

FIG. 12 depicts a flow chart diagram of one embodiment of a method 1200 for adaptive voltage range management in non-volatile memory. Although the method 1200 is described in conjunction with the electronic memory device 116 controller 114 of FIG. 1, embodiments of the method 1200 may be implemented with other types of electronic memory device controllers 114.

In one embodiment, the controller 114 establishes 1205 a voltage range 200 of an electronic memory device 116. In one embodiment, a means for establishing the adaptive voltage range 200 may include a controller 114, a driver, or a voltage range module 120. Other embodiments may include similar or equivalent means for establishing the voltage range 200. The voltage range may define the range of voltages within which the programming states are configured. The voltage range 200 may be the smallest voltage range 200 at which the programming states may be configured. The voltage range 200 may be calculated for the memory device 116 as a whole or for each individual memory element 126 within the memory device 116. The memory elements 126 may be SLC or MLC memory elements 126. In one embodiment, the voltage range 200 for the memory device 116 is determined to be the voltage range 200 for a memory element 126 having the largest minimum voltage range, such that the voltage range 200 is usable by all of the memory elements 126 in the memory device 116.

In one embodiment, the controller 114 programs 1210 the memory elements 126 to the programming states for the voltage range 200. In embodiments in which the memory elements 126 are MLC memory elements 126, each programming state may be representative of at least two bits of data. In embodiments in which the memory elements 126 are SLC memory elements 126, each state may be representative of one bit of data.

In one embodiment, the controller 114 is configured to modify the voltage range 200 of the electronic memory device 116 based on one or more device characteristics. Modifying the voltage range 200 results in the loss of any data of the memory element 126. Consequently, in one embodiment, any data of a memory element 126 having its voltage range modified may be relocated or otherwise preserved in advance of modification of the voltage range 200. Modifying the voltage range 200 may include the step of erasing the data stored in each memory element 126 of a modified erase block in the memory device 116. In one embodiment, the voltage range 200 is modified by the controller 114. In some embodiments, the current voltage range 200 for each erase block may be noted in a header at each erase block or in a mapping or using flags at the memory device 116 or at the controller 114. Other embodiments may store the voltage range 200 for the memory elements 126 using other methods. In another embodiment, the voltage range 200 is modified at a device-wide level.

In one embodiment, the voltage range is modified in response to the device characteristics reaching usage thresholds or based on various other device characteristics. Modifying the voltage range 200 of the memory device 116 may prolong the life of the individual memory elements 126 in the memory device 116. Modifying the voltage range 200 may include adjusting 720 one or more programming settings and read threshold settings for each programming state, for example, via commands issued to the memory elements 126 in the electronic memory device 116 to make specified adjustments. This may also include adjusting the programming settings and the read threshold settings for the LM state to account for adjustments in the programming settings and read threshold settings of the other programming states. The programming settings and read threshold settings may be adjusted by modifying internal settings of the memory elements 126. The voltage range 200 may be modified in response to the device characteristics reaching each of several thresholds. The thresholds may be determined based on a typical lifecycle of a memory element 126. The thresholds may be determined based on a worst-case scenario of the memory element 126. The memory element 126 may have several different stages based on P/E cycle count ranges, for example. The voltage range 200 for each stage is expanded to accommodate the worst-case scenario accuracy for the memory element 126. The worst-case scenario accuracy may be determined based on the ability of the memory element 126 to hold a charge within a given range of voltages. The worst-case scenario includes the voltages at the upper and lower edges of the given range of voltages. This may include adjusting an abode range between read threshold levels 202 for the programming states. The abode range may be the voltage difference between each of the read threshold levels 202 corresponding to the various programming states in the voltage range 200.

In one embodiment, the controller 114 establishes an adjustment process to asymmetrically adjust 1215 abode characteristics of at least two states in the voltage range 200. In various embodiments, a means for establishing the adjustment process may include a controller 114, a driver, or a voltage range module 120. Other embodiments may include similar or equivalent means for establishing an adjustment process. For examples of some changes that may be made to memory elements within a non-volatile memory device, reference may be made to U.S. patent application Ser. No. 13/015,458, filed on Jan. 27, 2011, and U.S. patent application Ser. No. 13/189,402, filed on Jul. 22, 2011, each of which is incorporated by reference herein in its entirety. Some of the adjustments that may be made in embodiments herein include fine-grained adjustment of the read threshold voltages 202 for the corresponding states. Fine-grained adjustments may include modifying each read threshold voltage 202 individually and/or asymmetrically. Fine-grained adjustments may include changing a particular read threshold voltage 202 to have either a higher or lower voltage (direction, e.g., right or left on the voltage scale 204) than it did previously. Alternatively, or additionally, fine-grained adjustments may include changing a particular read threshold voltage 202 by a particular amount or magnitude. Thus, the read threshold voltages 202 for each state may be adjusted independently from other states and by using different modification vectors (direction and magnitude) for each other state. Applying different adjustments, or adjustment factors, to each state is referred to herein as fine-grained adjustments. Applying a common adjustment, such as an adjustment factor, to at least two states may be referred to as large-grained adjustments. The width of each abode for the corresponding states may be adjusted. In one embodiment, the voltage boundaries for each of the states may be adjusted according to the asymmetric adjustment factors. Adjusting the abode characteristics may include compressing or expanding the adaptive voltage range and adjusting the lower state (such as the ERASE state) and the upper state in the voltage range 200 to fit to the compressed or expanded voltage range 200. In one embodiment, a lower end of the voltage range 200 is defined by a lowest voltage of the lower state, and an upper end of the voltage range 200 is defined by a highest voltage of the upper state.

In one embodiment, the states adjusted by the controller 114 are programming states. In another embodiment, the states adjusted by the controller 114 include the ERASE state and at least one other programming state. The states may be adjusted using different adjustment factors. The read threshold voltages 202 for the programming states may be adjusted in conjunction with the different adjustment factors.

In one embodiment, one of the programming states may be shifted to a different voltage level from an initial voltage level for the given programming state. The other programming states may be retained at corresponding initial voltages. The read threshold voltage 202 for the shifted state may be adjusted in conjunction with the different voltage level. This may result in the abode for the shifted programming state being asymmetrically adjusted relative to the other programming states.

In one embodiment, the voltage range 200 may be expanded beyond a default or initial voltage range set up by the manufacturer. When the voltage range 200 expands beyond the default voltage range, the upper tail 212 of the upper state is at a voltage level higher than in the default voltage range. Thus, the verify threshold voltage 208 for unselected word lines may be moved, for example, by the controller 114, to a higher voltage level from a default unselected word line voltage level. This may help prevent string failure due to overlap in the upper state and the verify threshold voltage 208 for unselected word lines. In another embodiment, the verify threshold voltage 208 may be moved to a lower voltage level when the voltage range 200 is compressed to prevent or reduce read disturb, which may affect the data stored in unselected memory elements 126. The voltage level of the verify threshold voltage 208 for unselected word lines may be, in one example, from about 4 volts to about 8 volts.

In one embodiment, the controller 114 re-programs the memory device 116 to a SLC mode in response to the P/E cycle count exceeding a P/E threshold. For example, the memory element 126 may be converted from MLC mode to SLC mode for P/E cycle counts greater than 15,000. Once the memory element 126 is converted to the fourth stage, the MLC element transitions to SLC mode and the abodes for the voltage range 200 are reset accordingly. The SLC mode may correspond to the upper page or the lower page of the memory element 126. If the SLC mode is set to the lower page, the LM state may be modified. If the SLC mode is set to the upper page, the read threshold for the SLC mode between the states ERASE and A may be moved according to the accuracy of the memory element 126 or for greatest longevity of the memory element 126.

While the device characteristics used for determining when to modify the voltage range 200 of the memory element 126 is described herein as including usage statistics such as a P/E cycle count, the device characteristics may include additional or alternative usage statistics, including an SNR, or other characteristics of the memory device 116. For example, if the SNR causes a BER to exceed a predetermined error threshold, the controller 114 may detect that the BER exceeds the error threshold and modify the voltage range 200 accordingly.

Figure 13:
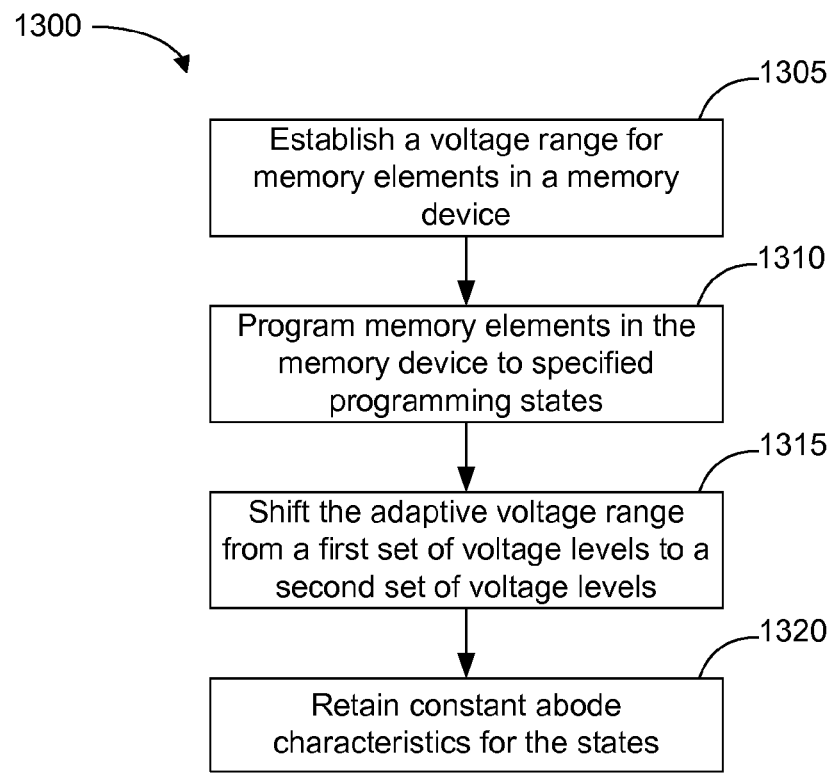
FIG. 13 depicts a flow chart diagram of one embodiment of a method for optimizing a voltage range for an electronic memory device.

FIG. 13 depicts a flow chart diagram of one embodiment of a method 800 for optimizing a voltage range 200 for an electronic memory device 116. Although the method 1300 is described in conjunction with the electronic memory device 116 controller 114 of FIG. 1, embodiments of the method 1300 may be implemented with other types of electronic memory device controllers 114.

In one embodiment, the controller 114 establishes 1305 a voltage range 200 of an electronic memory device 116. The voltage range may define the range of voltages within which the programming states are configured. The voltage range 200 may be the smallest voltage range 200 at which the programming states may be configured. The voltage range 200 may be calculated for the memory device 116 as a whole or for each individual memory element 126 within the memory device 116. The memory elements 126 may be SLC or MLC memory elements 126. In one embodiment, the voltage range 200 for the memory device 116 is determined to be the voltage range 200 for a memory element 126 having the largest minimum voltage range, such that the voltage range 200 is usable for all of the memory elements 126 in the memory device 116.

In one embodiment, the controller 114 programs 1310 a plurality of programming states for programming the electronic memory device 116. The memory device 116 includes MLC memory elements 126. The controller 114 sets the voltage range 200 corresponding to the programming states. In one embodiment, the controller 114 may determine an initial test setting for the voltage range 200 based on performance for a typical memory element 126.

In one embodiment, the controller 114 shifts the voltage range 200 and the states corresponding to the voltage range 200 from a first set of voltage levels to a second set of voltage levels. The voltage range 200 may be compressed from a default set of voltage levels, for example a set of voltage levels set by a manufacturer, to the first set of voltage levels. The voltage range 200 may be shifted so as to retain constant abode characteristics for each of the states from the first set of voltage levels to the second set of voltage levels. In one embodiment, the ERASE state and at least one other programming state are shifted from the first set of voltages to the second set of voltages. The read threshold voltages 202 for each corresponding state may be shifted for each corresponding state to the second set of voltage levels, thereby maintaining constant abode widths for the corresponding states from the first set of voltage levels to the second set of voltage levels. The voltage boundaries 206 for each of the corresponding programming states may also be shifted, which may maintain the same state widths from the first set of voltage levels to the second set of voltage levels.

In one embodiment, the controller monitors a device characteristic of the memory device 116 for a trigger event and then shifts the voltage range 200 and the states to different voltage levels on the voltage scale 204 in response to the trigger event. The trigger event may include a number of P/E cycles, device age, or other device characteristics. The controller 114 may also adjust the verify threshold voltage 208 for unselected word lines to maintain a guard band for the upper tail 212 of the upper state within a predetermined range of widths. Thus, if the voltage range 200 is shifted to the left on the voltage scale 204, the verify threshold voltage 208 for unselected word lines may shift left, and if the voltage range 200 is shifted to the right on the voltage scale 204, the verify threshold voltage 208 for unselected word lines may shift right.

While not shown, in one embodiment, the controller 114 monitors the BER for the memory device 116. The controller 114 may monitor the BER to determine if the current voltage range 200 is optimal. The controller 114 then adjusts the voltage range 200 of the memory device 116 in a closed-loop fashion, such that the memory device 116 uses as much error correction capability of the memory device 116, controller 114 and/or driver as possible. If the voltage range 200 is not large enough for the memory device 116, such that a high BER is produced, the voltage range 200 may be increased. High BER may be a result of the tails for the voltage boundaries 206 for the states crossing over the read thresholds 202. If the voltage range 200 has a BER that is easily handled by the error correction code implemented by the memory device 116, controller 114 and/or driver, the voltage range 200 may be narrowed to make use of the error correction capabilities of the memory device 116, the controller 114, a hardware driver, or a combination of these.

As the memory device 116 ages, the voltage range 200 may be expanded in response to the degradation of the accuracy of the memory device 116. In one embodiment, the degradation of the accuracy of the memory device 116 is determined by monitoring a BER for P/E cycles and read cycles. As the memory device 116 produces a higher BER for P/E cycles and read cycles, the error correction capability may become insufficient, and the voltage range 200 may be expanded. Expanding or compressing the voltage range 200 may include adjusting programming settings and read threshold settings for each programming state.

In one embodiment, the error correction capability includes hardware error correction for the memory device 116. Hardware error correction may allow for a higher BER than software error correction, which may produce higher error correction capability for OEM configurations in memory devices 116. Additionally, hardware error correction may be used in conjunction with software error correction to achieve better error correction. The voltage range 200 may then be minimized to use the excess error correction capabilities of the hardware error correction, and to take advantage of the accuracy of newer memory devices 116. In one embodiment, the voltage range 200 may be compressed until the BER is approximately equal to a maximum error correction capability of the memory device 116, though other configurations may be used.

An embodiment of the electronic memory device controller 114 includes at least one processor coupled directly or indirectly to memory elements through a system bus such as a data, address, and/or control bus. The memory elements can include local memory employed during actual execution of the program code, bulk storage, and cache memories which provide temporary storage of at least some program code in order to reduce the number of times code must be retrieved from bulk storage during execution.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, including an operation to monitor a pointer movement in a web page. The web page displays one or more content feeds. In one embodiment, operations to report the pointer movement in response to the pointer movement comprising an interaction gesture are included in the computer program product. In a further embodiment, operations are included in the computer program product for adaptive voltage range management in non-volatile memory.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Embodiments of the invention can take the form of an entirely hardware embodiment, an entirely software embodiment, or an embodiment containing both hardware and software elements. In one embodiment, the invention is implemented in software, which includes but is not limited to firmware, resident software, microcode, etc.

Furthermore, embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Input/output or I/O devices (including but not limited to keyboards, displays, pointing devices, etc.) can be coupled to the system either directly or through intervening I/O controllers. Additionally, network adapters also may be coupled to the system to enable the data processing system to become coupled to other data processing systems or remote printers or memory devices through intervening private or public networks. Modems, cable modems, and Ethernet cards are just a few of the currently available types of network adapters.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An electronic memory device controller, comprising:
a voltage range module configured to:
   compress a voltage range for a memory element of an electronic memory device from a first voltage range to a compressed voltage range, the memory element comprising at least a first state and a second state; and
   implement different adjustments to an abode characteristic of the first state and an abode characteristic of the second state, in response to a trigger event.

2. The controller of claim 1, wherein the voltage range module is further configured to adjust voltage boundaries for each of the first state and the second state according to asymmetric adjustment factors.

3. The controller of claim 1, wherein the voltage range module is further configured to adjust a width of an abode for each of the first state and the second state asymmetrically.

4. The controller of claim 1, wherein the voltage range module is further configured to make fine-grained adjustment of a read threshold voltage between the first state and the second state.

5. The controller of claim 1, wherein the trigger event comprises an error rate exceeding an error threshold.

6. The controller of claim 1, wherein the voltage range module is further configured to expand the voltage range and to adjust the first state and the second state to fit in the expanded voltage range.

7. The controller of claim 1, wherein the first state is a first programming state and the second state is a second programming state, wherein the first programming state is configured to represent at least a first bit value and the second programming state is configured to represent at least a second bit value.

8. The controller of claim 7, wherein the voltage range module is further configured to:

adjust the first programming state using first adjustment factors;
adjust the second programming state using second adjustment factors, wherein at least one adjustment factor of the second adjustment factors is different from the first adjustment factors;
adjust a first read threshold voltage for the first programming state in conjunction with the first adjustment factors; and
adjust a second read threshold voltage for the second programming state in conjunction with the second adjustment factors.

9. The controller of claim 8, wherein the voltage range module is further configured to:
shift the first programming state to a different voltage level from an initial voltage level for the first programming state while retaining the second programming state at an initial voltage level for the second programming state; and
adjust the read threshold voltage for the first programming state in conjunction with the different voltage level of the first programming state.

10. The controller of claim 1, wherein the voltage range module is further configured to:
expand the adaptive voltage range beyond the first voltage range; and
adjust a verify threshold voltage for unselected word lines (Vpass) to a voltage level that is higher than a default unselected word line voltage level.

11. A method comprising:
operating a memory element of an electronic memory device in an adaptive voltage range, wherein the memory element comprises at least a lower state and an upper state;
implementing a first adjustment of an abode characteristic of the lower state in response to a trigger event; and
implementing a second adjustment of an abode characteristic of the upper state in response to the trigger event, wherein the first adjustment is different from the second adjustment.

12. The method of claim 11, wherein implementing the first adjustment of the abode characteristic of the lower state and the second adjustment of the abode characteristic of the upper state comprises adjusting voltage boundaries for each of the lower state and the upper state according to asymmetric adjustment factors.

13. The method of claim 11, further comprising:
compressing the adaptive voltage range; and
adjusting the lower state and the upper state to fit within the compressed adaptive voltage range.

14. The method of claim 11, further comprising:
expanding the adaptive voltage range; and
adjusting the lower state and the upper state to fit within the expanded adaptive voltage range.

15. The method of claim 11, wherein implementing the first and second adjustments comprises shifting the lower and upper states from a first set of voltage levels to a second set of voltage levels in response to the trigger event, the method further comprising maintaining a width of a guard band between the lower and upper states at the second set of voltage levels equal to a width of a guard band between the lower and upper states at the first set of voltage levels.

16. The method of claim 15, further comprising:
shifting read threshold voltages for the lower and upper states to the second set of voltage levels;

maintaining abode widths for the lower and upper states from the first set of voltage levels to the second set of voltage levels; and voltage boundaries for the lower and upper states.

17. The method of claim 15, further comprising:

monitoring a device characteristic of the electronic memory device for the trigger event; and shifting the lower and upper states to higher voltage levels on a voltage scale in response to the trigger event.

18. An electronic memory device controller, the controller comprising:

means for establishing an adaptive voltage range for a memory element of an electronic memory device, the memory element comprising at least two states; and means for making a first adjustment of an abode characteristic of a first state and making a different adjustment of an abode characteristic of a second state in the adaptive voltage range in response to a trigger event.

19. The controller of claim 18, further comprising:

means for adjusting a width of an abode for each of the first state and the second state asymmetrically, in which adjustment factors applied to the first state are unequal to the adjustment factors applied to the second state.

20. A method, comprising:

configuring a memory element of an electronic memory device with a first state and a second state;

configuring a voltage range module to reduce a first voltage range of the memory element to a second, compressed voltage range; and adjusting an abode characteristic of the first state and an abode characteristic of the second state in response to a trigger event.

\* \* \* \* \*